United States Patent
Loizou et al.

(10) Patent No.: US 12,324,089 B2
(45) Date of Patent: Jun. 3, 2025

(54) MODULE CONDUCTIVE SHIELD INCLUDING DISCONTINUITIES TO REDUCE DEVICE COUPLING

(71) Applicant: Qorvo US, Inc., Greensboro, NC (US)

(72) Inventors: Loizos Loizou, Grasbrunn (DE); Domingo Farias, Methuen, MA (US); Vincenzo DiTommaso, Portland, OR (US); Jean Briot, Hillsboro, OR (US)

(73) Assignee: Qorvo US, Inc., Greensboro, NC (US)

( * ) Notice: Subject to any disclaimer, the term of this patent is extended or adjusted under 35 U.S.C. 154(b) by 190 days.

(21) Appl. No.: 17/956,974

(22) Filed: Sep. 30, 2022

(65) Prior Publication Data

US 2023/0180380 A1 Jun. 8, 2023

Related U.S. Application Data

(60) Provisional application No. 63/285,210, filed on Dec. 2, 2021.

(51) Int. Cl.
*H05K 1/02* (2006.01)
*H05K 1/18* (2006.01)

(52) U.S. Cl.
CPC ......... *H05K 1/0225* (2013.01); *H05K 1/0296* (2013.01); *H05K 1/181* (2013.01); *H05K 2201/1006* (2013.01); *H05K 2201/10371* (2013.01)

(58) Field of Classification Search
CPC .... H05K 1/0225; H05K 1/0296; H05K 1/181; H05K 9/0024; H05K 9/0022; H05K 2201/0707; H05K 2201/0969; H05K 2201/1006; H05K 2201/10371
See application file for complete search history.

(56) References Cited

U.S. PATENT DOCUMENTS

| | | | | |
|---|---|---|---|---|
| 5,578,961 | A * | 11/1996 | Fajen | G05F 3/205 327/104 |
| 2015/0271959 | A1* | 9/2015 | Chen | H05K 3/284 361/760 |
| 2017/0118875 | A1* | 4/2017 | Kumbhat | H01L 21/561 |
| 2019/0297757 | A1* | 9/2019 | Henzler | H05K 1/0216 |
| 2019/0307028 | A1* | 10/2019 | Yazaki | H01Q 1/243 |

OTHER PUBLICATIONS

Aigner, R. et al., "BAW Filters for 5G Bands," IEEE International Electron Device Meeting (IEDM), Dec. 1-5, 2018, San Francisco, CA, USA, IEEE, 4 pages.

(Continued)

*Primary Examiner* — Timothy J Thompson
*Assistant Examiner* — Paramita Ghosh
(74) *Attorney, Agent, or Firm* — Withrow & Terranova, P.L.L.C.

(57) ABSTRACT

A module includes discontinuities, such as openings or slots, between regions of a conductive shield that correspond to circuits on a substrate. The discontinuities are provided to perturb current flow between the regions to reduce coupling between the circuits. The circuits may be transmit (TX) circuits and receive (RX) circuits, including acoustic filters on a printed circuit board.

20 Claims, 10 Drawing Sheets

(56) References Cited

OTHER PUBLICATIONS

Hagelauer, A. et al., "Microwave Acoustic Wave Devices: Recent Advances on Architectures, Modeling, Materials, and Packaging," IEEE Transactions on Microwave Theory and Techniques, vol. 66, Issue 10, Oct. 2018, first published Jul. 2018, IEEE, 15 pages.
Li, M. et al., "A fully matched LTE-A carrier aggregation quadplexer based on BAW and SAW technologies," 2014 IEEE International Ultrasonics Symposium, Sep. 3-6, 2014, Chicago, IL, USA, IEEE, 5 pages.
Link, A. et al., "Golden Age for Filter Design: Innovative and Proven Approaches for Acoustic Filter, Duplexer, and Multiplexer Design," IEEE Microwave Magazine, vol. 16, Issue 7, Aug. 2015, first published Jul. 2015, IEEE, 13 pages.
Yue, C.P et al., "On-Chip Spiral Inductors with Patterned Ground Shields for Si-Based RF IC's," IEEE Journal of Solid-State Circuits, vol. 33, Issue 5, May 1998, 10 pages.

\* cited by examiner

MODULE CONDUCTIVE SHIELD INCLUDING DISCONTINUITIES TO REDUCE DEVICE COUPLING

RELATED APPLICATIONS

This application claims the benefit of U.S. provisional patent application Ser. No. 63/285,210, filed on Dec. 2, 2021, the disclosure of which is hereby incorporated herein by reference in its entirety.

FIELD OF THE DISCLOSURE

The technology of the disclosure relates generally to electronic packaging and, more particularly, to reducing coupling between neighboring circuits.

BACKGROUND

Modern consumer electronic devices demand more dense and compact printed circuit boards and more carrier aggregation combinations to achieve higher data rates. This requires newer electronic devices to fit more circuits into a smaller volume. As circuits are located closer together, isolations between a transmitter (TX) circuit and receiver (RX) circuits become more critical in a TX module with several RX acoustic filters that may all work simultaneously. Undesired couplings in the module alter the performance of components, especially bulk acoustic wave (BAW) and surface acoustic wave (SAW) filters, degrading TX-to-RX isolations, sometimes leading to very severe specification violations. A conductive layer covering the top and sides of the module is included on a module on a printed circuit board (PCB) to improve the module's thermal behavior and act as a shield limiting electromagnetic radiation between the module and other components on the PCB. However, adding a conductive layer to a module changes the TX-to-RX isolations between components within the module compared with open top parts (e.g., modules without a conductive layer).

SUMMARY

Aspects disclosed in the detailed description include a module conductive shield, including discontinuities to reduce device coupling. Modules may be capped with a conductive shield to reduce electromagnetic coupling between circuits in the module and circuits outside the module, such as circuits in other modules on a printed circuit board (PCB). Inside the module, the conductive shield can increase coupling between circuits or devices due to the interaction of currents induced in the inner part of the conductive shield by electromagnetic radiation of circuits on the module. An exemplary module disclosed herein includes discontinuities, such as openings or slots, between regions of a conductive shield that correspond to circuits on a substrate to perturb current flow between the regions to reduce coupling between the circuits. In some examples, the circuits are transmit (TX) circuits and receive (RX) circuits, including acoustic filters.

An exemplary module disclosed herein comprises a substrate, a conductive shield, a first circuit on the substrate in a first region, and a second circuit on the substrate in a second region. The first and second circuits are between the conductive shield and the substrate, and the conductive shield comprises a discontinuity between the first and second regions to reduce current flow in the conductive shield between the first region and the second region.

In another exemplary aspect, a method is disclosed, the method comprising disposing a first circuit in a first region of a substrate and disposing a second circuit in a second region of the substrate. The method further discloses forming a conductive shield on the first region and the second region of the substrate. The method also discloses forming a discontinuity in the conductive shield between the first region and the second region to perturb current flow between the first region and the second region.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
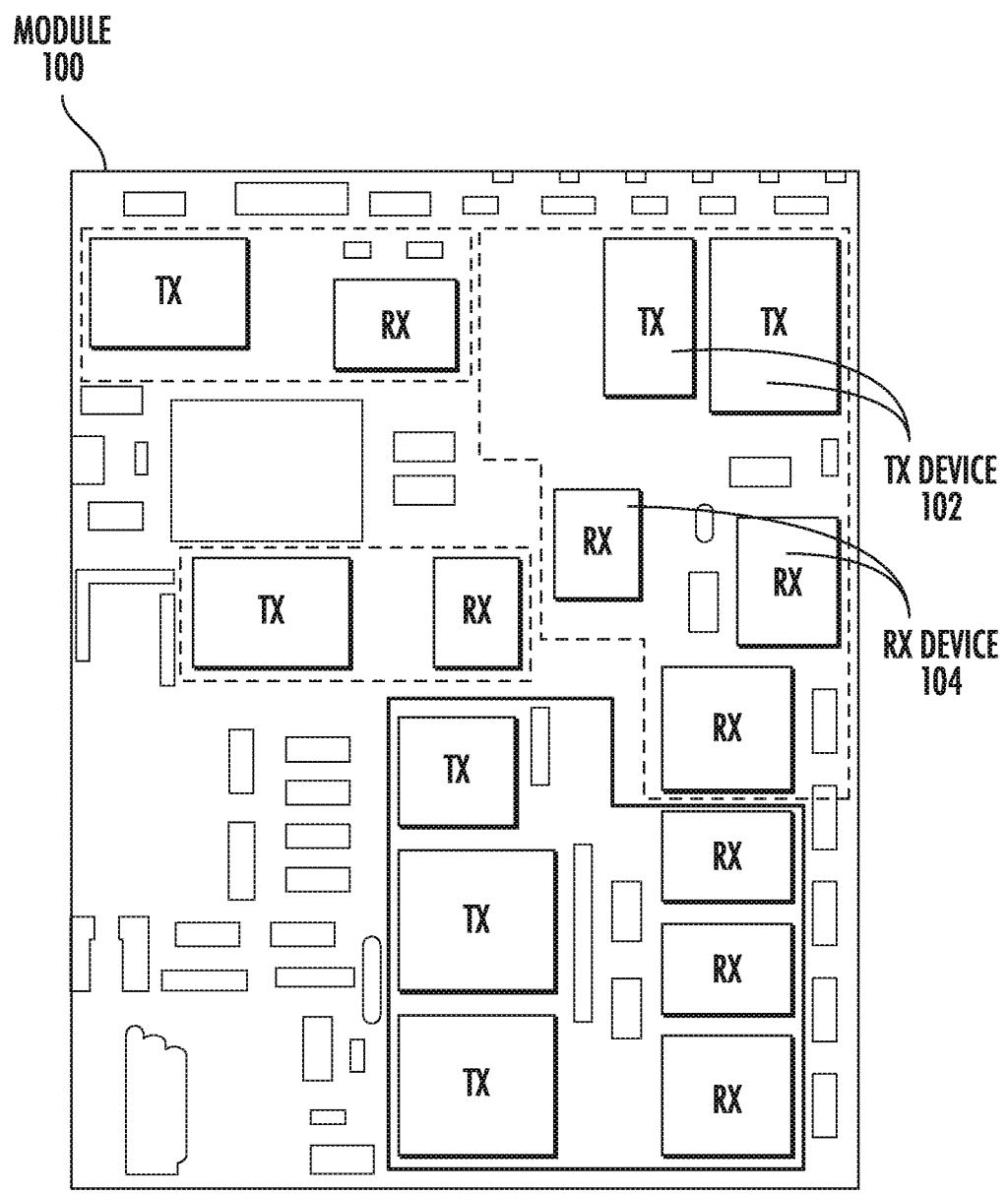
FIG. 1 is a top view of an example of a circuit diagram of a radio frequency (RF) module, including the filter dies and switches forming the multiplexing network.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With the introduction of fifth-generation (5G) technology, more devices need to be integrated into the radio frequency (RF) front-end modules in order to support all carrier aggregation and bandwidth enhancement needed for the new applications. Many of these devices are acoustic filters, bulk acoustic wave (SAW), or surface acoustic wave (SAW), usually forming a multiplexer with the assistance of switches needed to cover all new and existing frequency bands and combinations. Other examples of these devices include power amplifiers and low-noise amplifiers.

Despite the addition and integration of more devices, the overall system size of mobile devices is reduced, and the end user device manufacturers demand more year-over-year reductions in size while the performance requirements become more stringent.

Adding more filters and larger switches without increasing the module size requires the distance between components to be reduced, which in turn presents challenges in the packaging and manufacturability of the products as placement and routing are tighter with minimum shielding.

Challenges are also presented in the thermal behavior and the electromagnetic interference of such devices, as the mobile device platforms include more modules and other components while becoming smaller. A conductive and/or metallic coating is usually used around the RF-module package, connected to the system ground (e.g., a reference voltage such as 0 volts) to provide electromagnetic interference shielding and additional heat-sinking.

Both simulations and experimentation have found that the shield affects the isolation and leakage performance of the system. Isolation and leakage become increasingly important as new frequency bands, and carrier aggregation cases are added to the system requirements. In most cases, filters are responsible for meeting these requirements, but other mechanisms on the module, such as coupling—die-to-die, on laminate routing, die-to-surface-mounted device, for example—and sneak paths can degrade the performance.

Sensitivity, the minimum signal level the receiver can detect, is a performance parameter for RF systems and is related to the isolation of the RX paths. In turn, sensitivity is related to another performance parameter of these systems, de-sense, for which the isolation and leakage between TX and RX paths are of critical importance.

The module shield plays a role in this regard since current can be generated on its surface by radiating devices and can couple to any neighboring device or structure. Bond wires are currently used to connect from a ground on the laminate surface to the module shield to mitigate these phenomena. Bond wires, of course, come with additional manufacturing costs and require a certain area on the laminate for their implementation because a certain distance is required from a bonding wire to adjacent components.

The present disclosure relates to a method of creating slots on targeted locations on the shield to help improve the system isolations and leakage. A slot on the shield surface across the module between the TX and RX devices can minimize the current flow between them, breaking some of the coupling mechanisms. Furthermore, such slots can be created on the shield around switches, between blocks of the multiplexer network, and between the power amplifier and filters section, for example.

The method, according to the present disclosure, offers improvements in system isolation and leakage performance, eliminating the cost of bond wires and reducing the part size. Data based on full electromagnetic simulations are presented.

FIG. 1 shows a top view circuit diagram of a module 100, which may be a radio-frequency (RF) module 100, including circuits employed in telecommunications and processing devices, for example. The module 100 includes transmit (TX) devices 102 and receive (RX) devices 104, which may be acoustic filters, including bulk acoustic wave (BAW) or surface acoustic wave (SAW) devices. Series inductors (not shown) are used to connect each filter to the multiplexing network, and other inductors and capacitors are utilized to create the impedance transformation and loading conditions needed by the filters for optimal performance. A typical RF module may have two hexaplexers and several other filters connected through switches, for a total of 20 BAW dies or more, for example, in a highly complex system.

The TX devices 102 and RX devices 104 filters in the RF module 100 generate electromagnetic (EM) radiation and may also be influenced by external sources of EM radiation. In this regard, in the discussion herein, the TX devices 102 and RX devices 104 are merely examples of circuits that can be generators of EM radiation and sensitive to EM interference from neighboring circuits. Other examples of such circuits employed in RF modules 100 include power amplifiers (PAs) and low noise amplifiers (LNAs) and their associated input matching and output matching circuits. For example, inductors in such circuits may be both EM generators and sensitive to EM interference from other circuits.

For example, a TX device 102 may generate EM radiation based on a signal to be transmitted, and the RX device 104 may generate EM radiation based on a received signal. Each TX device 102 and RX device 104 may include one or more acoustic wave devices and may be referred to herein as filters, devices, components, and/or circuits. A printed circuit board in a mobile device may be populated with many modules, including RF module 100 and other types. The EM radiation generated by the TX and RX devices 102, 104 in the RF module 100 on a printed circuit board (PCB) can interfere with devices in neighboring modules. In addition, the TX and RX devices 102, 104 may be affected by EM fields radiating from other modules. In particular, the RX devices 104 in the RF module 100 may be provided to filter out all but a desired frequency or range of frequencies, and such operation may be negatively affected by EM fields from external sources. TX and RX devices 102, 104 are merely examples of circuit components that may generate EM radiation and may be affected by EM radiation to varying degrees and are discussed in the following examples herein as representative of any such circuit components.

Figure 2A:
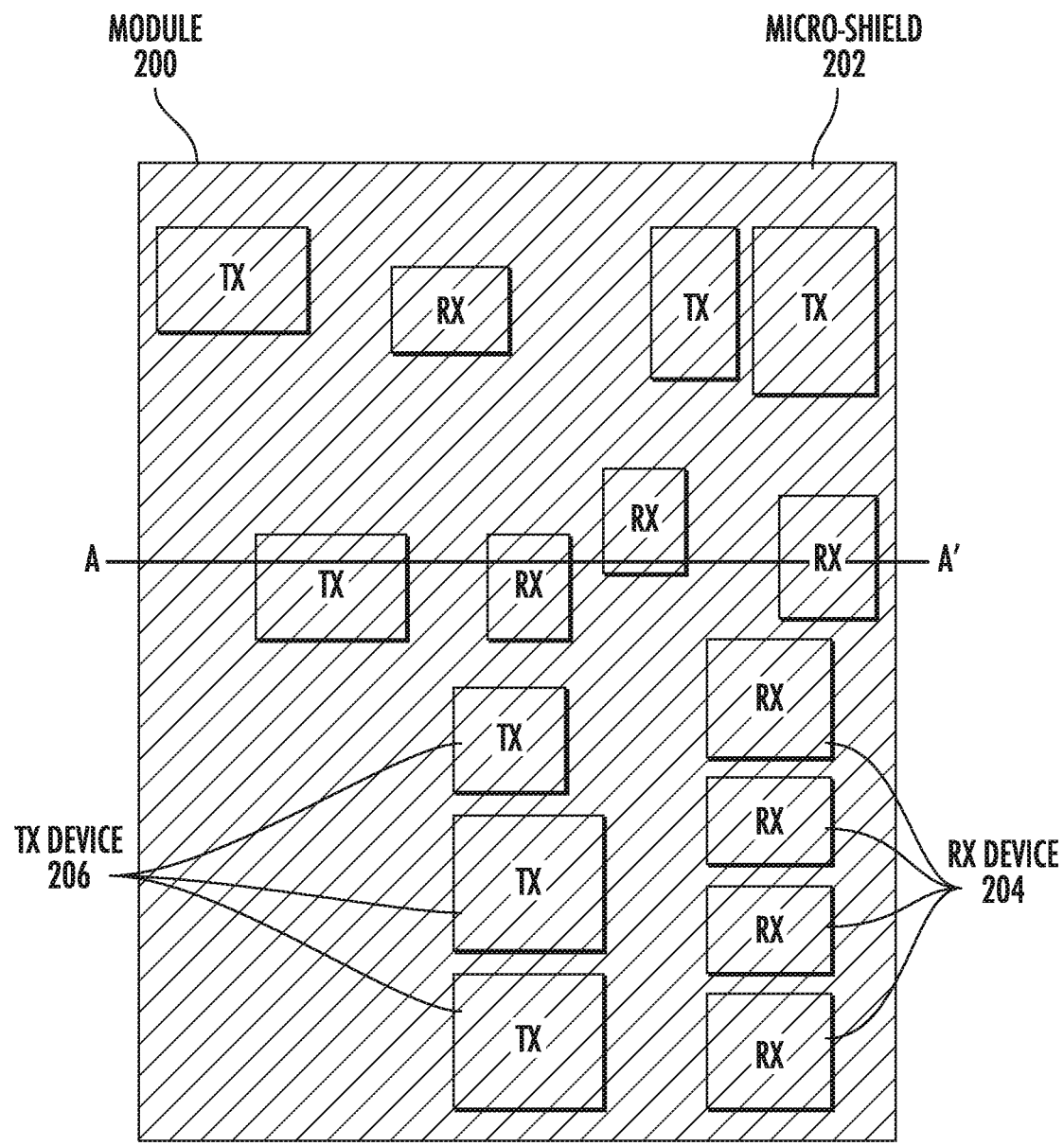
FIG. 2A is a block diagram top view of the RF module in FIG. 1 indicating receive (RX) devices and transmit (TX) devices and a conductive shield (micro-shield)

To protect against EM interference between neighboring modules on a PCB, an RF module 200, shown in FIG. 2, includes a conductive and/or metallic layer 202. The metallic shield is also referred to herein as a "micro-shield 202" and is disposed on the top and sides of the RF module 200 to provide a Faraday cage to block EM radiation into and out of the RF module 200. FIG. 2A is a block diagram of a top view of the RF module 200, with a circuit layout similar to the RF module 100 in FIG. 1 and also including a top view of the micro-shield 202.

FIG. 2A identifies RX devices 204 and TX devices 206 disposed the RF module 200. The RX devices 204 and the TX devices 206 are grouped together such that there is some separation between the RX devices 204 and the TX devices 206. However, despite the grouping, there are still very small distances between the TX devices 206 and the RX devices 204. During operation of the RF module 200, the EM fields of the RX devices 204 and the TX devices 206 induce currents in the micro-shield 202. When there are small separation distances between the TX devices 206 and the RX devices 204, these currents in the micro-shield 202 can interact with each other, influencing the EM fields they are associated with, which is an example of EM coupling between neighboring devices on the same RF module 200. Although not explicitly shown here, the spaces between the RX devices 204 and the TX devices 206 may be occupied by other circuits. In densely populated modules, such as the RF module 200, there may be limited options for changing the floor plan to reduce or avoid EM coupling.

Figure 2B:
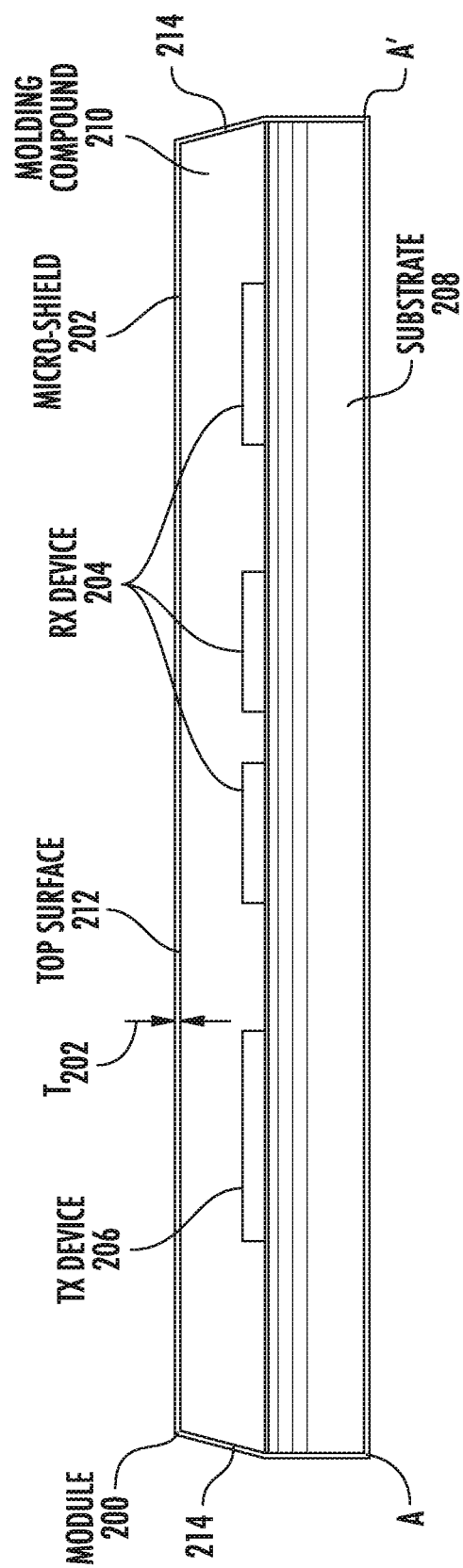
FIG. 2B is a cross-sectional side view of the RF module in FIG. 2A.

FIG. 2B is a cross-sectional side view of the RF module 200 in FIG. 2A taken along the plane A-A'. The RX devices 204 and the TX devices 206 are disposed on a substrate 208. A molding compound 210 is disposed on the RX devices 204, the TX devices 206, and the substrate 208. FIG. 2B shows the micro-shield 202 disposed on a top surface 212 and side surfaces 214 of the molding compound 210. The micro-shield 202 is a layer of conductive material, such as copper/nickel (Cu/Ni), Cu/steel, or suitable conductive material, having a uniform thickness $T_{202}$ formed on the molding compound 210. The micro-shield 202 may be formed by sputtering or another known deposition/evaporation process.

Figure 3A:
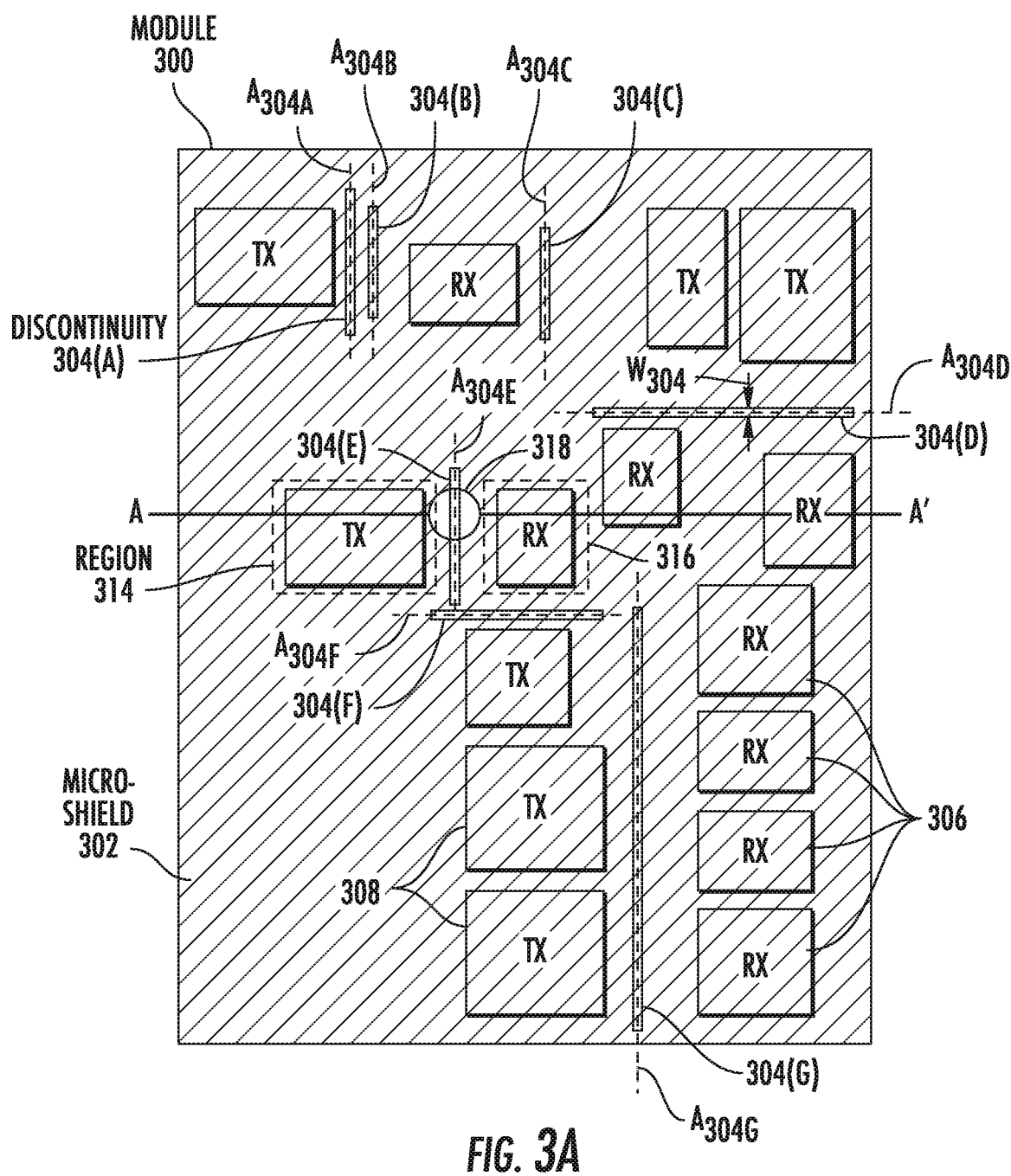
FIG. 3A is a top view of an exemplary RF module, including a micro-shield with an example of a discontinuity, such as linear openings or slots to disrupt current flow that causes electromagnetic (EM) coupling between devices.

FIG. 3A is a top view of an exemplary RF module 300, including a conductive shield 302 ("micro-shield 302") with discontinuities 304(A)-304(G) (collectively "discontinuities 304") to reduce currents that cause coupling between RX devices 306 and TX devices 308. The discontinuities 304 are described in more detail with reference to FIG. 3A and FIG. 3B, which is a cross-sectional side view of the RF module 300 taken along A-A'.

Figure 3B:
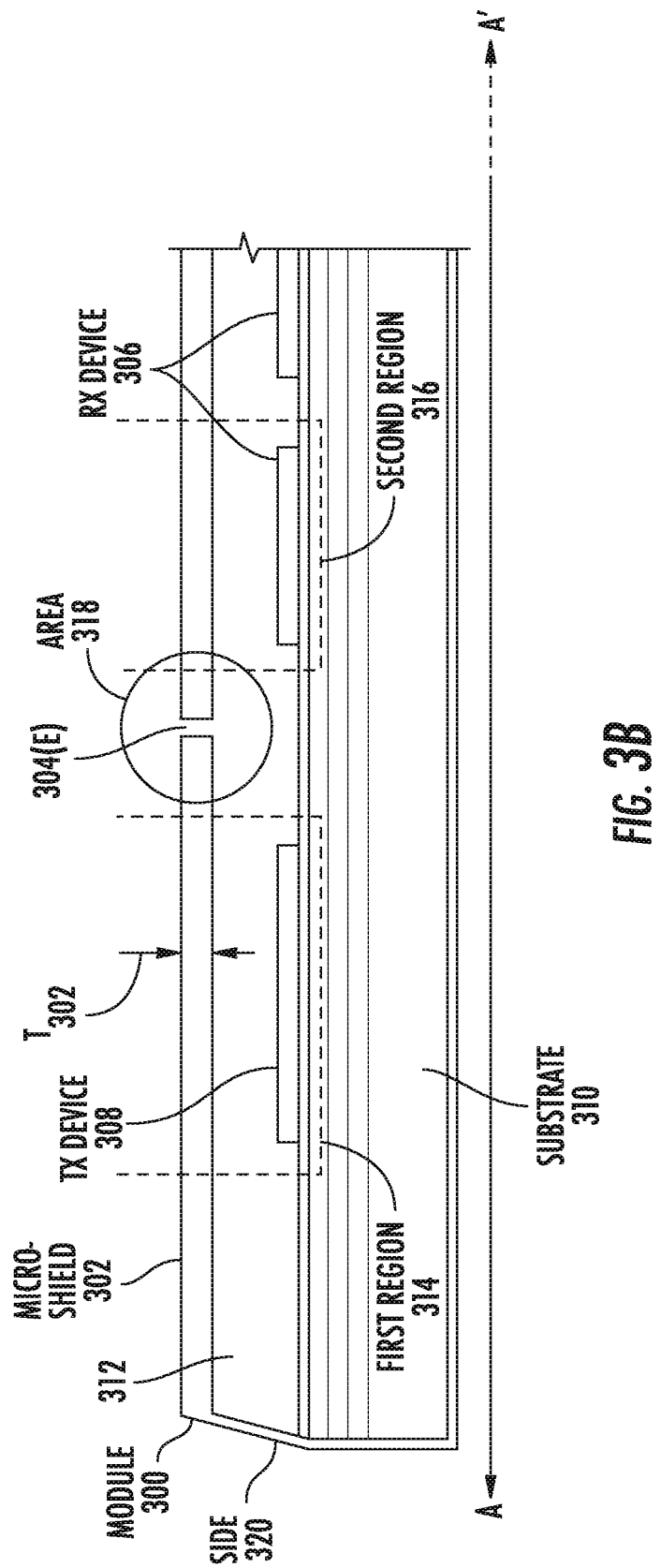
FIG. 3B is a cross-sectional side view of a portion of the RF module in FIG. 3A illustrating an opening as an example of a discontinuity in the micro-shield.

The RX devices 306 and TX devices 308 are on a substrate 310. The micro-shield 302 covers the RF module 300, with the RX devices 306 and TX devices 308 between the substrate 310 and the micro-shield 302. As shown in FIG. 3B, the RF module 300 may also include a molding compound 312, with the micro-shield 302 being a metal layer disposed on the molding compound 312 at least in regions of the substrate 310 that include RX devices 306 and TX devices 308. Each of the discontinuities 304 is located between a region comprising an RX device 306 and a region comprising a TX device 308.

For example, discontinuity 304(E) reduces or eliminates current flowing in the micro-shield 302 from a first region 314, in which an RX device 306 is located on the substrate 310, and a second region 316 in which a TX device 308 is located on the substrate 310. The discontinuities 304 are openings, such as slots extending longitudinally along linear axes $A_{304A}$-$A_{304G}$ and also extending (e.g., vertically) through a thickness $T_{302}$ of the micro-shield 302. The discontinuities 304 have width $W_{304}$ in a direction orthogonal to the linear axes $A_{304A}$-$A_{304G}$. The discontinuities 304(A)-304(G) may, but do not necessarily, have a same width $W_{304}$. A discontinuity 304 having a narrow width $W_{304}$ blocks current flow between a portion of the micro-shield 302 in the first region 314 and a portion of the micro-shield 302 in the second region 316. Increasing the width $W_{304}$ may reduce protection against interference between the RF module 300 and external sources, so keeping the width $W_{304}$ as narrow as possible maximizes the protection against electromagnetic interference. The minimum width $W_{304}$ may be dependent on manufacturing processes for creating the discontinuities 304. As an example, the width $W_{304}$ of a discontinuity formed by a laser may be in a range of 20 to 60 microns (μm). Discontinuities 304 formed by other processes may have a width $W_{304}$ that is narrower or wider than such range. The discontinuities 304 may be any length, such as up to 2000 μm or more. The discontinuities 304 may extend down sides 320 of the RF module 300.

The discontinuity 304(E) is shown in the cross-section in circled area 318 in FIG. 3B. FIG. 3B shows that the discontinuity 304(E) extends entirely through the thickness $T_{302}$, preventing current flow between the first region 314 and the second region 316 to reduce EM coupling between the RX device 306 and the TX device 308.

The discontinuities 304 may be formed in the micro-shield 302 by one or more of a variety of methods, including mechanical, chemical, and optical processing. For example, after the micro-shield 302 is formed on the molding compound 312, methods such as micromachine milling, chemical etching, molded deposition, laser cutting, and three-dimensional microprinting can be utilized to form the discontinuities 304 effectively. Alternatively, a mask may be applied to the molding compound 312 before the micro-shield 302 is deposited by sputtering.

Figure 4:
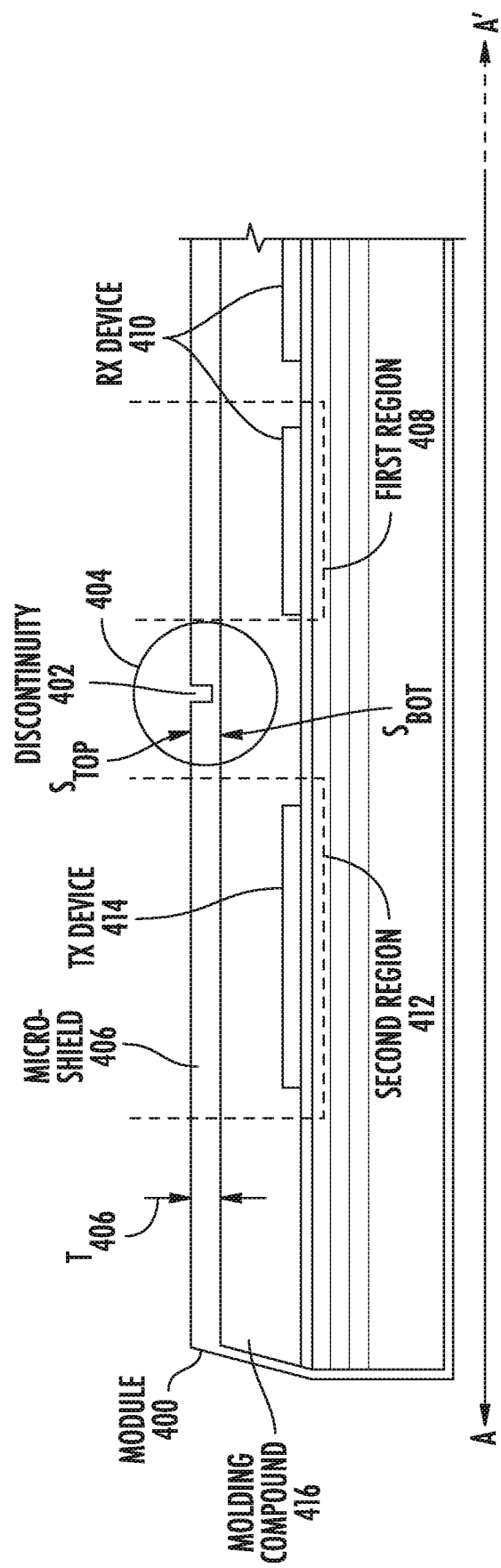
FIG. 4 is a cross-sectional side view of the portion of the RF module in FIG. 3B, illustrating another example of a discontinuity in the micro-shield.

FIG. 4 is an illustration of a cross-sectional side view of an RF module 400, which is an alternative example in which a discontinuity 402 in an area 404 extends partially, but not entirely, through a thickness $T_{406}$ of a micro-shield 406. In the discontinuity 402, a thickness of metal in the micro-shield 406 is significantly thinner than in the first region 408, corresponding to an RX device 410, and a second region 412, corresponding to a TX device 414. In this example, the discontinuity 402 comprises an opening in a top surface $S_{TOP}$ of the micro-shield 406. In another alternative, the discontinuity 402 may also be an opening in a bottom surface $S_{BOT}$ (based on a ridge previously formed in a molding compound 416). The discontinuity 402 may also be formed in both the top surface $S_{TOP}$ and the bottom surface $S_{BOT}$. In addition, the discontinuity 402 may extend entirely through the micro-shield in some areas and not entirely through in others (e.g., in a pattern) over an extent of the discontinuity 402. The purpose of the discontinuities (e.g., openings or slots) is to perturb the currents existing on the conductive shield and force them in a different direction. The discontinuities present high impedance paths, forcing the current to a different path of lower impedance. This redirection of the induced on-shield currents changes the coupling mechanisms between components of the module and affects certain isolation cases.

In further detail, the eddy current generated in the micro-shield 406 by the electromagnetic field of a radiating device (Tx or Rx) will only penetrate partially into a surface of the metal in the micro-shield 406 and will remain concentrated close to the surface. This penetration depth ("skin depth") depends on properties of the metal and on a frequency of the signal. If the discontinuity does not fully penetrate through the micro-shield 406, the remaining thin metal region of the discontinuity 304 may be thinner than the skin depth, causing perturbation of the eddy current, which reduces coupling between Tx and Rx devices. A typical value for this skin depth considering standard metal conductor (Cu, Au) and 1-5 GHz EM signal is normally in the range of 1 to 2 um.

Many different implementations of the discontinuities exist, and their optimally desired positions can be determined through simulations that evaluate performance benefits and trade-offs. Slots of straight or curved configurations crossing one another or any other possible combination can be implemented.

Figure 5:
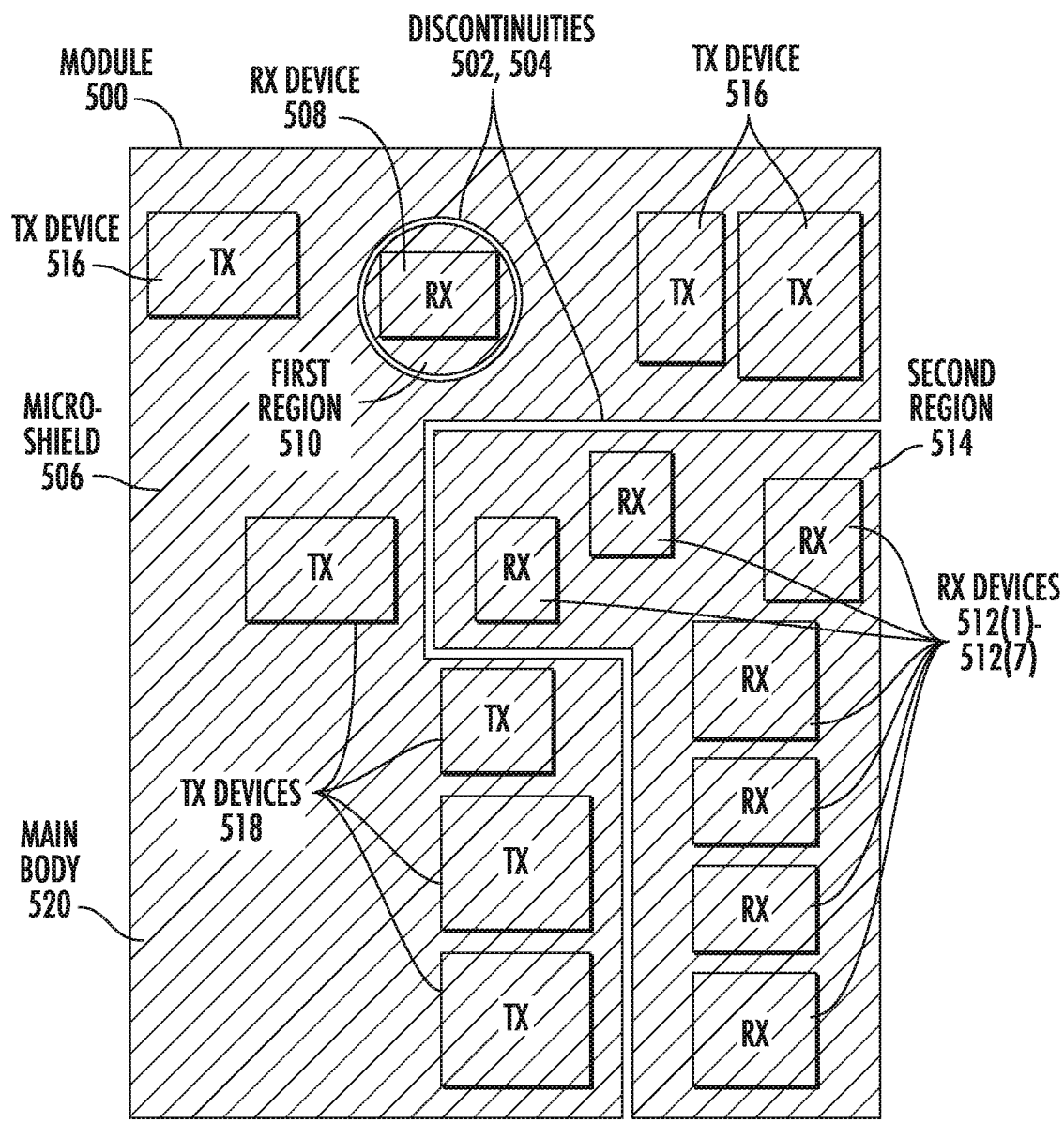
FIG. 5 is a top view of another RF module illustrating an example of discontinuities in a micro-shield to isolate a portion of the micro-shield to reduce coupling between devices.

FIG. 5 is a top view of an RF module 500, showing another example of discontinuities 502 and 504 in a micro-shield 506. RX device 508 is in a first region 510 of the micro-shield 506, and RX devices 512(1)-512(7) are in a second region 514 of the micro-shield 506. The discontinuities 502 and 504 isolate first and second regions 510, 514 of the micro-shield 506 from a main body 520 of the micro-shield 506 to protect the RX devices 508 and 512(1)-512(6) from EM coupling to TX devices 516 and 518. The discontinuity 502 includes an arc between the RX device 508 and the TX devices 516. Although the discontinuity 502 is a full circle, other examples may include semi-circular arcs and arcs of more or fewer degrees than a semi-circle. The discontinuity 504 is one example of a pattern including one or more linear openings or slots in the micro-shield 506.

Figure 6:
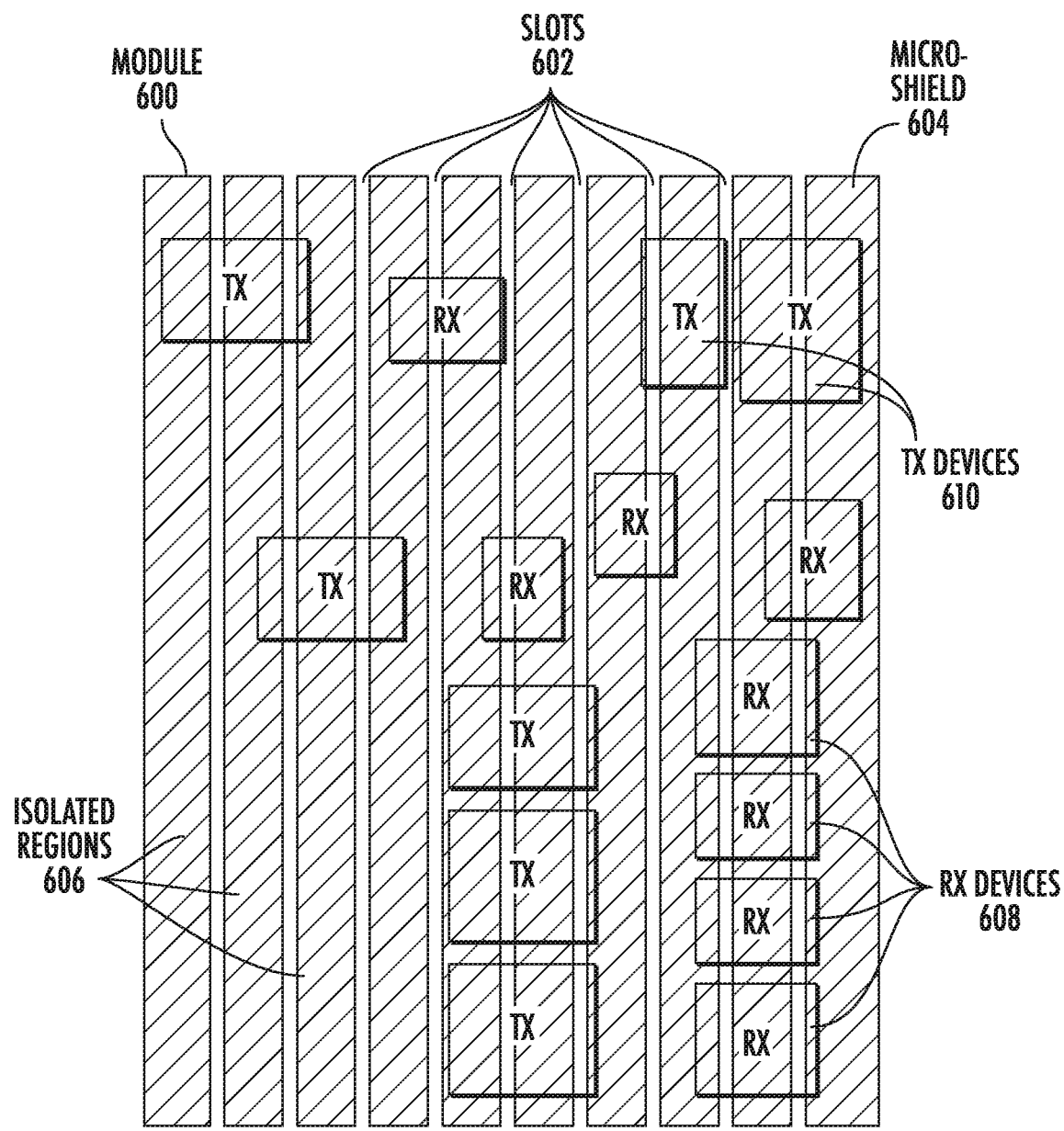
FIG. 6 is a top view of another RF module illustrating another example of discontinuities as parallel slots in a micro-shield to reduce coupling between devices.

FIG. 6 is another example of an RF module 600 as disclosed herein, including parallel slots 602 splitting a micro-shield 604 into isolated regions 606 to reduce EM coupling between RX devices 608 and TX devices 610.

Figure 7:
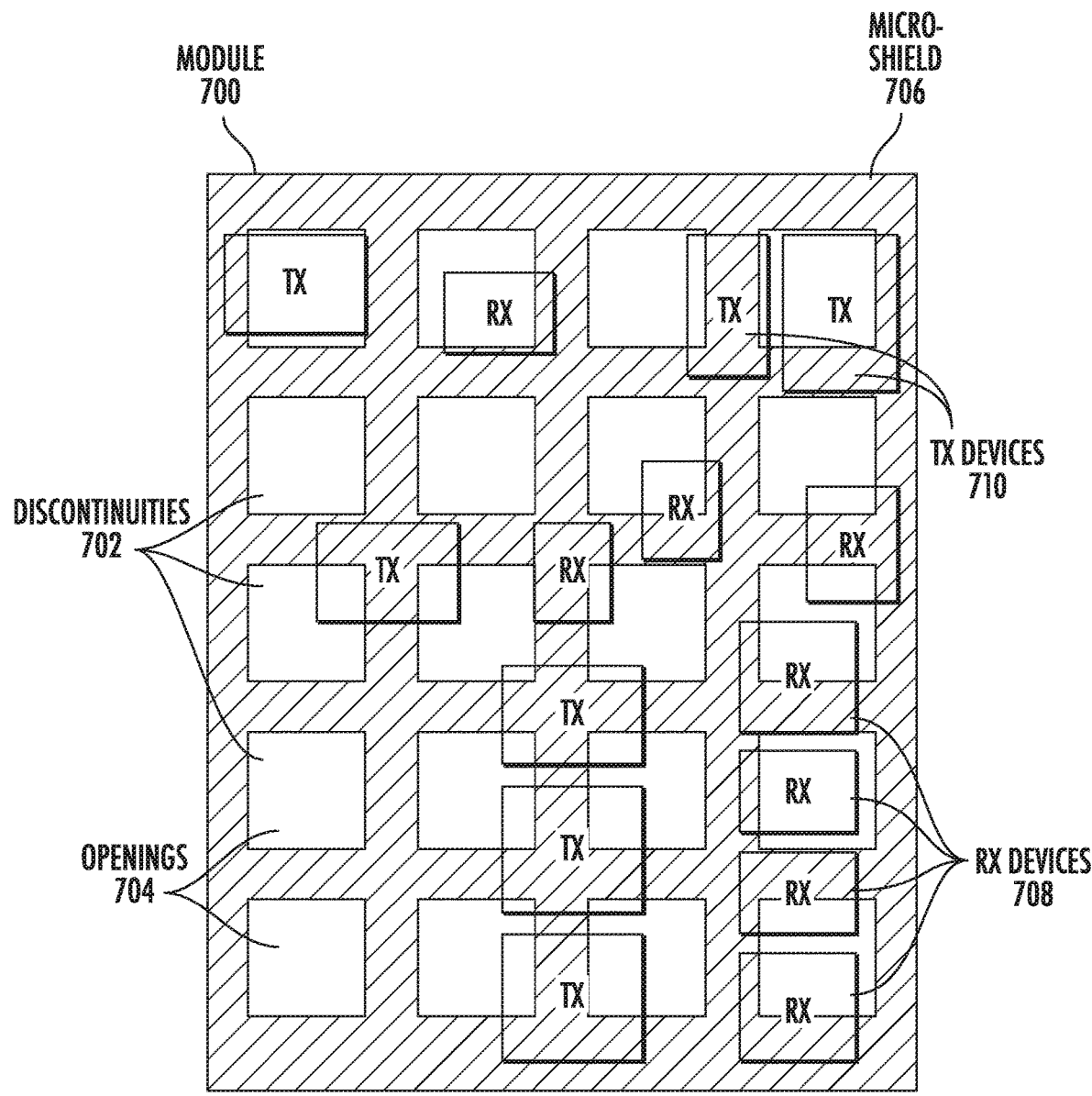
FIG. 7 is a top view of another RF module, including another example of discontinuities as an array of openings in a micro-shield to reduce coupling between devices.

FIG. 7 is another example of an RF module 700, including an array of discontinuities 702, which include openings 704 in a micro-shield 706 to reduce EM coupling between RX devices 708 and TX devices 710.

Figure 8:
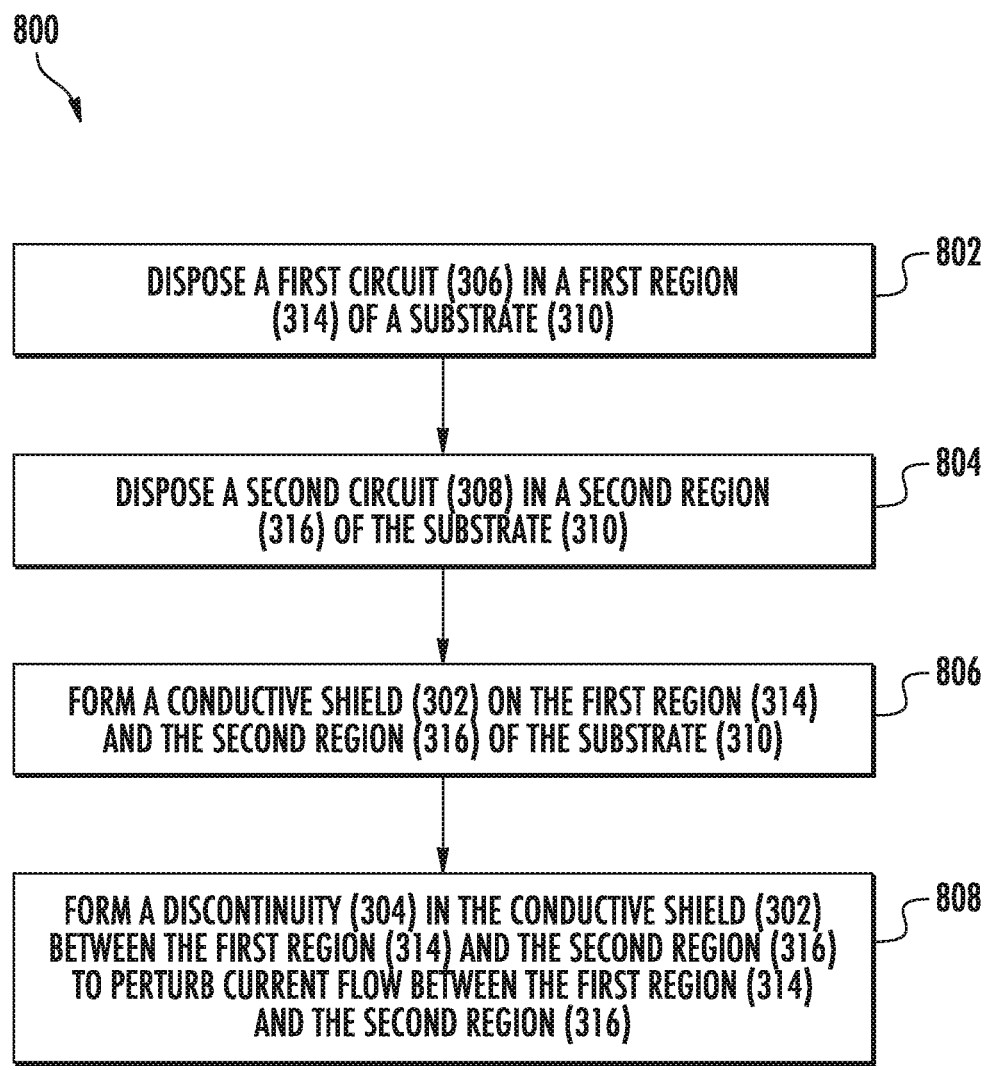
FIG. 8 is a flowchart of a method of fabricating the RF module in at least FIGS. 3A and 3B.

FIG. 8 is a flowchart illustrating a method of fabricating a module as disclosed herein and shown in any of FIGS. 3A-7. The method includes disposing a first circuit (306) in a first region (314) of a substrate (310) (block 802) and disposing a second circuit (308) in a second region (316) of the substrate (310) (block 804). The method further includes forming a conductive shield (302) on the first region (314) and the second region (316) of the substrate (310) (block 806). The method also includes forming a discontinuity (304) in the conductive shield (302) between the first region (314) and the second region (316) to perturb current flow between the first region (314) and the second region (316) (block 808).

Creating slots on the micro-shield of an RF front-end module can improve the sensitivity and de-sense performance. As described, the slots can be placed to target separate and specific areas of the module; such as TX devices from RX devices, filter blocks from other filters, and multiplexer networks from surface-mount devices, switches, low-noise amplifiers, power amplifiers, and other components.

Slots can be made horizontally along the module, vertically, diagonally, or with certain angles. Slots can be of a straight configuration, curved, splined, or other configuration. Combinations of the foregoing are also possible, with slots having different or even variable widths and lengths.

Those skilled in the art will recognize improvements and modifications to the present disclosure. All such improvements and modifications are considered within the scope of the concepts disclosed herein.

What is claimed is:

1. A module comprising:
   a substrate;
   a conductive shield;
   a first circuit on the substrate in a first region; and
   a second circuit on the substrate in a second region;
   wherein:
      the first circuit and the second circuit are between the conductive shield and the substrate; and
      the conductive shield comprises a discontinuity between and delimiting a circumferential boundary for the first region and the second region to reduce current flow in the conductive shield between the first region and the second region.

2. The module of claim 1, further comprising a molding compound on the first and second circuits between the conductive shield and the substrate.

3. The module of claim 2, wherein the conductive shield comprises a metal layer on the molding compound in at least the first region and the second region.

4. The module of claim 1, wherein the discontinuity comprises an opening through a thickness of the conductive shield.

5. The module of claim 4, wherein the opening comprises a linear slot between the first region and the second region.

6. The module of claim 5, wherein the linear slot extends in a first direction and comprises a slot width of at least 20 microns (µm) in a second direction orthogonal to the first direction.

7. The module of claim 6, wherein the slot width is in a range of 45 to 60 μm.

8. The module of claim 5, wherein the linear slot is comprised in a pattern of one or more openings in the conductive shield.

9. The module of claim 4, wherein the opening extends in an arc between the first circuit and the second circuit.

10. The module of claim 1, wherein the discontinuity electrically isolates a portion of the conductive shield in the first region from a portion of the conductive shield in the second region.

11. The module of claim 1, wherein the discontinuity prevents current flow across the discontinuity between a portion of the conductive shield in the first region and a portion of the conductive shield in the second region.

12. The module of claim 1, wherein a thickness of the conductive shield in the discontinuity is less than 2 microns (μm).

13. The module of claim 1, wherein at least one of the first circuit and the second circuit comprises an acoustic filter.

14. The module of claim 13, wherein the first circuit comprises a transmit circuit and the second circuit comprises a receive circuit.

15. The module of claim 1, wherein at least one of the first circuit and the second circuit comprises a power amplifier or a low-noise amplifier.

16. The module of claim 1, wherein the discontinuity comprises a void in a surface of the conductive shield, not extending entirely through a thickness of the conductive shield.

17. The module of claim 16, wherein the void is in a side of the conductive shield closer to the first circuit and the second circuit.

18. The module of claim 1, wherein at least one of the first circuit and the second circuit comprises an inductor.

19. The module of claim 1, wherein the conductive shield is coupled to a reference voltage.

20. A method of fabricating a module, comprising:
   disposing a first circuit in a first region of a substrate;
   disposing a second circuit in a second region of the substrate;
   forming a conductive shield covering the first region and the second region of the substrate; and
   forming a discontinuity in the conductive shield between and delimiting a circumferential boundary between the first region and the second region to perturb current flow between the first region and the second region.

* * * * *